United States Patent
Lopatin et al.

(10) Patent No.: US 6,621,165 B1
(45) Date of Patent: *Sep. 16, 2003

(54) SEMICONDUCTOR DEVICE FABRICATED BY REDUCING CARBON, SULPHUR, AND OXYGEN IMPURITIES IN A CALCIUM-DOPED COPPER SURFACE

(76) Inventors: Sergey Lopatin, 1000 Kiely Blvd., #66, Santa Clara, CA (US) 95051; Paul L. King, 1376 Snow St., Mountain View, CA (US) 94041; Joffre F. Bernard, 3140 Mark Ave., Santa Clara, CA (US) 95051

( * ) Notice: Subject to any disclaimer, the term of this patent is extended or adjusted under 35 U.S.C. 154(b) by 0 days.

This patent is subject to a terminal disclaimer.

(21) Appl. No.: 10/154,871

(22) Filed: May 23, 2002

Related U.S. Application Data

(62) Division of application No. 09/728,312, filed on Nov. 30, 2000, now Pat. No. 6,444,580.

(51) Int. Cl.[7] .......................... H01L 23/48; H01L 23/52

(52) U.S. Cl. ...................... 257/741; 257/762; 257/767; 257/798

(58) Field of Search ................... 438/687, 740, 438/681, 3, 107; 257/741, 767, 762, 798

(56) References Cited

U.S. PATENT DOCUMENTS

| | | | |
|---|---|---|---|
| 6,353,848 B1 | * 3/2002 | Morris | 709/203 |
| 6,444,580 B1 | * 9/2002 | Lopatin et al. | 438/687 |
| 6,469,387 B1 | * 10/2002 | Lopatin et al. | 257/750 |
| 6,475,272 B1 | * 11/2002 | Lopatin | 106/287.18 |
| 6,509,262 B1 | * 1/2003 | Lopatin | 438/658 |

OTHER PUBLICATIONS

Peter Van Zant, Microchip Fabrication: A Practical Guide to Semiconductor Processing, (1997), 397, 3rd Edition, McGraw–Hill, USA.

* cited by examiner

Primary Examiner—Michael S. Lebentritt

(57) ABSTRACT

A semiconductor device having contaminant-reduced calcium-copper (Ca—Cu) alloy surfaces formed on Cu interconnects fabricated by cost-effectively removing the contaminant layer. Contaminant removal from a Cu—Ca—X surface, where contaminant X=C, S, or O, is achieved by sputtering the Cu—Ca—X surface in an argon (Ar) atmosphere between the steps of (a) immersing the Cu interconnect surface into an electroless plating solution comprising Cu salts, Ca salts, their complexing agents, a reducing agent, a pH adjuster, and at least one surfactant for facilitating Ca-doping of the Cu interconnect material; and (b) annealing of the Ca—Cu alloy surface onto the underlying Cu interconnect material to form a Ca—Cu/Cu interconnect structure, whereby the sputtering step, under Ar, selectively and effectively removes contaminants from the Cu—Ca—X layer containing higher concentrations of C, S, or O, thereby minimizing the post-annealed contaminant level, and thereby producing a uniform Ca—Cu alloy surface (i.e., Cu-rich with 0.2–5% Ca) on the Cu interconnect material for maximizing Ca—Cu/Cu interconnect structure reliability, electromigration resistance, and corrosion prevention. The annealing step primarily removes O and secondarily removes C and S, especially when performed under vacuum, an inert gas, or a reducing ambient such as ammonia ($NH_3$) plasma. Thus, the resultant device then comprises a distinctive contaminant-reduced Ca—Cu/Cu interconnect structure.

19 Claims, 2 Drawing Sheets

SEMICONDUCTOR DEVICE FABRICATED BY REDUCING CARBON, SULPHUR, AND OXYGEN IMPURITIES IN A CALCIUM-DOPED COPPER SURFACE

CROSS-REFERENCE TO RELATED APPLICATION(S)

This application is a divisional application of, and claims priority from, U.S. patent application Ser. No. 09/728,312 filed Nov. 30, 2000 now U.S. Pat. No. 6,444,580 and is also related to following commonly assigned applications which have been concurrently filed with the priority application:

1. U.S. Ser. No. 09/728,313, entitled "Chemical Solution for Cu—Ca—O thin film formations on Cu Surfaces;"
2. U.S. Ser. No. 09/728,315, entitled "Method of Forming Cu—Ca—O Thin Films on Cu Surfaces in a Chemical Solution and Semiconductor Device Thereby Formed," and issued as U.S. Pat. No. 6,291,348 B1 on Sep. 18, 2001;
3. U.S. Ser. No. 09/728,314, entitled "Method of Calcium Doping a Cu Surface Using a Chemical Solution and Semiconductor Device Thereby Formed;"
4. U.S. Ser. No. 09/728,684, entitled "Method of Reducing Electromigration in Copper Lines by Calcium-Doping Copper Surfaces in a Chemical Solution and Semiconductor Device Thereby Formed;" and
5. U.S. Ser. No. 09/728,685, entitled "Method of Reducing Electromigration in Copper Lines by Forming an Interim Layer of Calcium-Doped Copper Seed Layer in a Chemical Solution and Semiconductor Device Thereby Formed," issued as U.S. Pat. No. 6,353,848 B1 on, Mar. 19, 2002.

TECHNICAL FIELD

The present invention relates to semiconductor devices and their methods of fabrication. More particularly, the present invention relates to the processing of calcium-copper alloy interconnect material and the resultant device utilizing the same. Even more particularly, the present invention relates to reducing and minimizing carbon, sulphur, and oxygen impurities in a calcium-copper alloy interconnect surface.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractor metals. Despite aluminum's (Al) adequate resistance, other Al properties render it less desirable as a candidate for these higher density devices, especially with respect to its deposition into plug regions having a high aspect ratio cross-sectional area. Thus, research into the use of copper (Cu) as an interconnect material has been revisited, copper being advantageous as a superior electrical conductor, providing better wettability, providing adequate electromigration resistance, and permitting lower depositional temperatures. Cu interconnect material may be deposited by CVD, PECVD, sputtering, electroless plating, and electrolytic plating. However, some disadvantages of using Cu as an interconnect material include etching problems, corrosion, and diffusion into silicon. These problems have sparked further research into the formulation of barrier materials for Cu, which in turn, identified another host of problems associated with the barrier materials themselves (e.g., contamination).

In response to interconnect impurity level concerns relating to the fabrication of semiconductor devices having copper (Cu) alloy interconnect surfaces, the industry has been utilizing chemical vapor deposition (CVD) methods. Ca is an inherently highly reactive element in air; therefore, Cu—Ca alloys would behave similarly. Contamination in the Cu—Ca alloys is especially problematic when wet-chemical methods are used for processing. Cu—Ca alloy surfaces have been found to be highly susceptible to carbon (C), sulphur (S), and oxygen (O) contamination, forming an impure layer on the order of 10–20 Å in thickness, as

[1] Peter Van Zant, Microchip Fabrication: A Practical Guide to Semiconductor Processing, 3$^{rd}$ Ed., p. 397 (1997). characterized by AES/XPS methods.

However, although CVD has been conventionally used for depositing other metal(s) on an interconnect surface, CVD is not a cost-effective method of doping Cu interconnect surfaces with Ca ions. Therefore, a need exists for providing a method of fabricating a semiconductor device having contaminant-reduced Ca—Cu alloy on Cu interconnect surfaces by cost-effectively removing the contaminant layer.

BRIEF SUMMARY OF THE INVENTION

Accordingly, the present invention provides a method of fabricating a semiconductor device having contaminant-reduced Ca—Cu alloy surfaces formed on Cu interconnects by cost-effectively removing the contaminant layer and a device thereby formed. Contaminant removal from a Cu—Ca—X surface, where contaminant X=C, S, or O, is achieved by sputtering the Cu—Ca—X surface in an Ar atmosphere between the steps of (a) immersing the Cu interconnect surface into an electroless plating solution comprising Cu salts, Ca salts, their complexing agents, a reducing agent, a pH adjuster, and at least one surfactant for facilitating Ca-doping of the Cu interconnect material; and (b) annealing of the Ca—Cu alloy surface onto the underlying Cu interconnect material to form a Ca—Cu/Cu interconnect structure, whereby the sputtering step, under argon (Ar), selectively and effectively removes contaminants from the Cu—Ca—X layer containing higher concentrations of C, S, or O, thereby minimizing the post-annealed contaminant level, and thereby producing a uniform Ca—Cu alloy surface (i.e., Cu-rich with 0.2–5% Ca) on the Cu interconnect material for maximizing Ca—Cu/Cu interconnect structure reliability, electromigration resistance, and corrosion prevention. The annealing step primarily removes O and secondarily removes C and S, especially when performed under vacuum, an inert gas, or a reducing ambient such as ammonia ($NH_3$) plasma. Thus, the resultant device then comprises a distinctive contaminant-reduced Ca—Cu/Cu interconnect structure.

BRIEF DESCRIPTION OF THE DRAWING

For a better understanding of the present invention, reference is made to the below-referenced figures of the accompanying Drawing. Reference numbers refer to the same or equivalent parts of the present invention throughout the several figures of the Drawing.

DETAILED DESCRIPTION OF THE INVENTION

Figure 1:
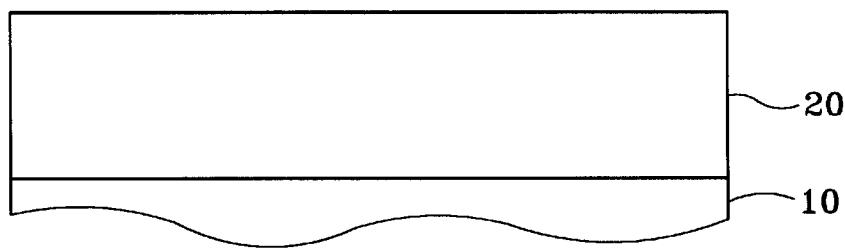
FIG. 1 is a cross-sectional view of a semiconductor substrate having formed thereon a Cu film via a conventional method such as PVD or CVD, in accordance with the related art.

FIG. 1 illustrates, in cross-section, a semiconductor substrate 10 such as a silicon wafer, having formed thereon a Cu film 20 via a conventional method such as PVD or CVD, in accordance with the related art.

Figure 2:
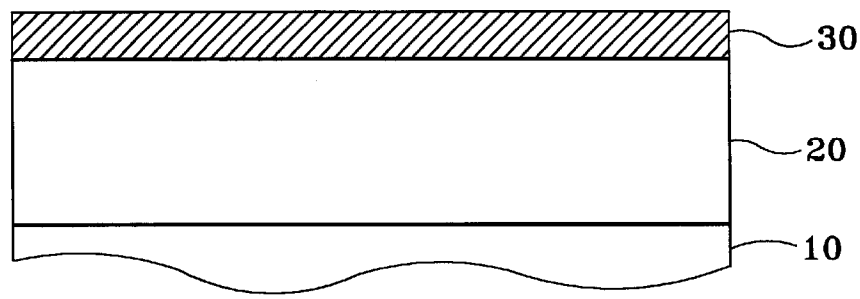
FIG. 2 is a cross-sectional view of the semiconductor substrate having formed thereon the Cu film, the Cu film having formed thereon a Cu—Ca—X film via treatment in an electroless plating solution, as shown in FIG. 1, in accordance with the present invention.

FIG. 2 illustrates, in cross-section, the semiconductor substrate 10, having formed thereon the Cu film 20, as shown in FIG. 1, the Cu film 20 having formed thereon a Cu—Ca—X film 30, where X=C, S, and/or O, via treatment in an electroless plating solution, in accordance with the present invention.

Figure 3:
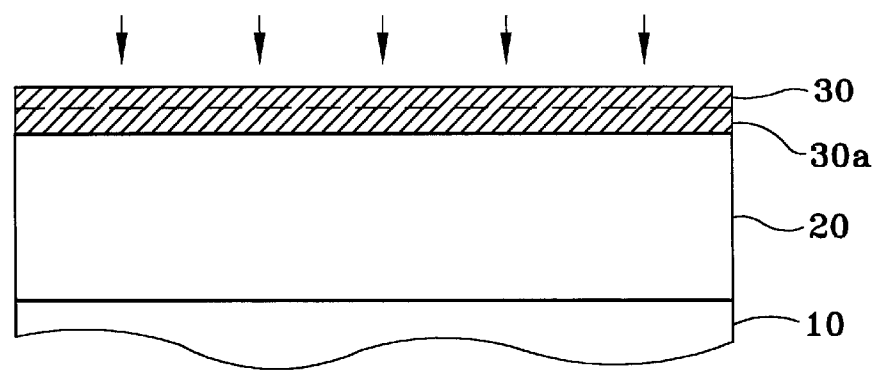
FIG. 3 is a cross-sectional view of the semiconductor substrate having formed thereon the Cu film, the Cu film having formed thereon a Cu—Ca—X film via treatment in an electroless plating solution, as shown in FIG. 2, the Cu—Ca—X film being further processed by a technique, the technique being selected from a group of techniques consisting essentially of (a) sputtering under an Ar atmosphere and (b) treating in a plasma ambient, for removing contaminants such as C, S, and O, effecting a thin Cu—Ca film on the Cu film, in accordance with the present invention.

FIG. 3 illustrates, in cross-section, the semiconductor substrate 10 having formed thereon the Cu film 20, the Cu film 20 having formed thereon the Cu—Ca—X film 30 via treatment in the electroless plating solution, as shown in FIG. 2, the Cu—Ca—X film being further processed by a technique, the technique being selected from a group of techniques consisting essentially of (a) sputtering under an Ar atmosphere and (b) treating in a plasma ambient, for removing contaminants such as C, S, and O, effecting a thin Cu—Ca film 30a on the Cu film 20, in accordance with the present invention.

Figure 4:
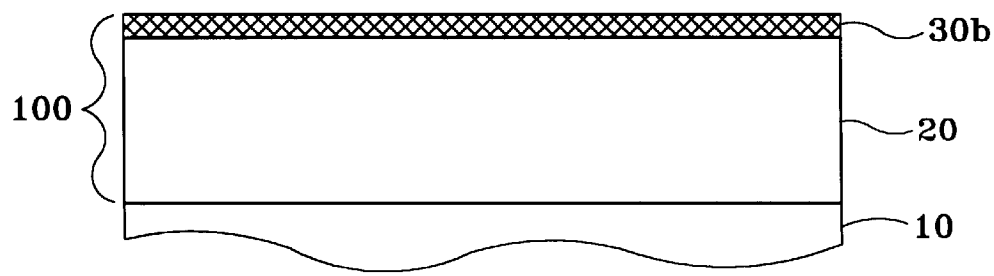
FIG. 4 is a cross-sectional view of the semiconductor substrate having formed thereon the Cu film, the Cu film having formed thereon the Cu—Ca—X film via treatment in the electroless plating solution, the Cu—Ca—X film being further processed by the technique being selected from the group of techniques consisting essentially of (a) sputtering under an Ar atmosphere and (b) treating in a plasma ambient, for removing contaminants such as C, S, and O, effecting the thin Cu—Ca film on the Cu film, as shown in FIG. 3, the Cu—Ca film being annealed in a range of 250° C. to 450° C., under vacuum, onto the Cu film, forming a Cu—Ca alloy surface onto the Cu film, thereby forming a contaminant-reduced Ca—Cu/Cu interconnect structure, in accordance with the present invention.

FIG. 4 illustrates, in cross-section, the semiconductor substrate 10 having formed thereon the Cu film 20, the Cu film 20 having formed thereon the Cu—Ca—X film 30 via treatment in an electroless plating solution, the Cu—Ca—X film 30 being further processed by the technique being selected from the group of techniques consisting essentially of (a) sputtering under an Ar atmosphere and (b) treating in a plasma ambient, for removing contaminants such as C, S, and O, effecting the thin Cu—Ca film 30a on the Cu film 20, as shown in FIG. 3, the Cu—Ca film 30a being annealed in a range of 250° C. to 450° C., under vacuum, onto the Cu film 20, forming a Cu—Ca alloy surface 30b onto the Cu film 20, thereby forming a contaminant-reduced Ca—Cu/Cu interconnect structure 100, in accordance with the present invention. Further, the chemical solution may comprise an electroless plating solution, which in turn, may comprise Cu salts, Ca salts, complexing agents, reducing agents, pH adjusters, and surfactants. The Cu—Ca alloy surface is Cu-rich and may have a Ca-doping level in a range of 0.2 atomic % to 5 atomic %.

Figure 5:
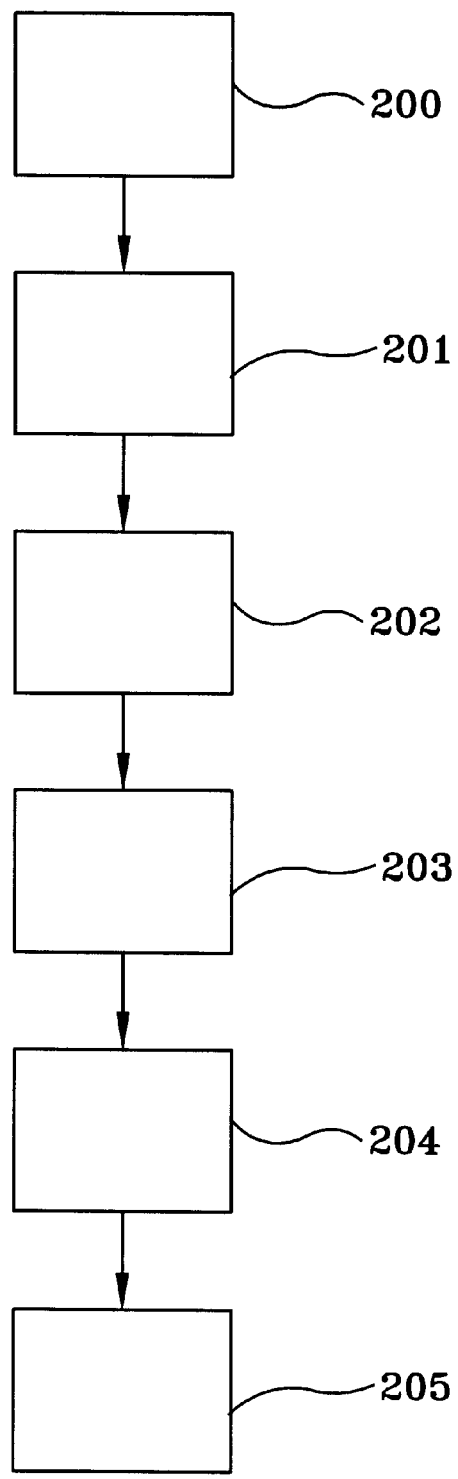
FIG. 5 is a flowchart of a method for fabricating a semiconductor device having a contaminant-reduced Ca—Cu/Cu interconnect structure, in accordance with the present invention.

FIG. 5 is a flowchart of a method M for fabricating a semiconductor device having a contaminant-reduced Ca—Cu/Cu interconnect structure 100, in accordance with the present invention. The method M comprises the steps of: providing a semiconductor substrate, as indicated by block 200; depositing a Cu film 20 on a semiconductor substrate 10 via a method such as PVD or CVD, as indicated by block 201; treating the Cu film 20 in an electroless plating solution, thereby depositing a Cu—Ca—X film 30 onto the Cu film 20, as indicated by block 202; processing the Cu—Ca—X film 30 by a technique selected from a group of techniques consisting essentially of (a) sputtering under an Ar atmosphere and (b) treating in a plasma ambient, thereby removing at least one contaminant selected from a group of contaminants consisting essentially of C, S, and O from the Cu—Ca—X film 30, and thereby effecting a thin Cu—Ca film 30a on the Cu film 20, as indicated by block 203; annealing the substrate 10 having formed thereon the Cu film 20, the Cu film 20 having formed thereon the thin Cu—Ca film 30a, in a range of 250° C. to 450° C., under vacuum, whereby the Cu and the Ca metals are alloyed together, thereby forming a Cu—Ca alloy surface 30b onto the Cu film 20, and thereby forming a contaminant-reduced Ca—Cu/Cu interconnect structure 100, as indicated by block 205; and completing formation of the semiconductor device, as indicated by block 205, in accordance with the present invention.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A semiconductor device, having a contaminant-reduced copper-calcium alloy surface on a copper (Cu—Ca/Cu) interconnect structure, comprising:

a semiconductor substrate;

a Cu film deposited on the semiconductor substrate; and a Cu—Ca alloy surface deposited on the Cu film, the Cu film comprising a electroless plating treatment, said electroless plating treatment comprising an electroless plating solution for facilitating doping of the Cu film with at least one plurality of ions selected from a group consisting essentially of Cu ions and Ca ions, whereby a Cu—Ca—X film is formed on the Cu film, wherein X denotes at least one contaminant, the Cu—Ca—X film comprising a removing technique selected from a group consisting essentially of: sputtering under an Ar atmosphere, and treating in a plasma ambient for initially removing the at least one contaminant, and whereby a thin Cu—Ca film is effected on the Cu film, the thin Cu—Ca film comprising an annealing treatment for finally removing the at least one contaminant, the thin Cu—Ca film being alloyed, whereby a contaminant-reduced Cu—Ca alloy surface is formed onto the Cu film, and whereby the contaminant-reduced Cu—Ca/Cu interconnect structure, comprising the contaminant-reduced Cu—Ca alloy surface, is formed on the semiconductor device, the Cu film comprising a depositing technique selected from a group consisting essentially of electroplating, electroless plating, chemical vapor deposition (CVD), plasma vapor deposition (PVD), and plasma enhanced chemical vapor deposition (PECVD), the electroless plating solution comprising:
 a. at least one solvent;
 b. at least one Cu salt;
 c. at least one Ca salt;
 d. at least one complexing agent; and
 e. at least one reducing agent, (b) through (e) being dissolved in (a), electroless plating solution further comprising:
 f. at least one pH adjuster; and
 g. at least one surfactant, (f) and (g) being dissolved in (a), and the at least one contaminant being selected from a group consisting essentially of carbon (C), sulphur (S), and oxygen (O).

2. A semiconductor device, having a contaminant-reduced copper-calcium alloy surface on a copper (Cu—Ca/Cu) interconnect structure, comprising:

a semiconductor substrate;

a Cu film deposited on the semiconductor substrate; and a Cu—Ca alloy surface deposited on the Cu film, the Cu film comprising a electroless plating treatment, said electroless plating treatment comprising an electroless plating solution for facilitating doping of the Cu film with at least one plurality of ions selected from a group consisting essentially of Cu ions and Ca ions, whereby a Cu—Ca—X film is formed on the Cu film, wherein X denotes at least one contaminant, the Cu—Ca—X film comprising a removing technique selected from a group consisting essentially of: sputtering under an Ar atmosphere, and treating in a plasma ambient for initially removing the at least one contaminant, and whereby a thin Cu—Ca film is effected on the Cu film, the thin Cu—Ca film comprising an annealing treatment for finally removing the at least one contaminant, the thin Cu—Ca film being alloyed, whereby a contaminant-reduced Cu—Ca alloy surface is formed onto the Cu film, and whereby the contaminant-reduced Cu—Ca/Cu interconnect structure, comprising the contaminant-reduced Cu—Ca alloy surface, is formed on the semiconductor device, the Cu film comprising a depositing technique selected from a group consisting essentially of electroplating, electroless plating, chemical vapor deposition (CVD), plasma vapor deposition (PVD), and plasma enhanced chemical vapor deposition (PECVD), the at least one contaminant being selected from a group consisting essentially of carbon (C), sulphur (S), and oxygen (O), and the Cu—Ca alloy surface being Cu-rich with a Ca-doping level in a range of 0.2 atomic % to 5 atomic %.

3. A semiconductor device, having a contaminant-reduced copper-calcium alloy surface on a copper (Cu—Ca/Cu) interconnect structure, comprising:

a semiconductor substrate;

a Cu film deposited on the semiconductor substrate; and a Cu—Ca alloy surface deposited on the Cu film, the Cu film comprising a electroless plating treatment, said electroless plating treatment comprising an electroless plating solution for facilitating doping of the Cu film with at least one plurality of ions selected from a group consisting essentially of Cu ions and Ca ions, whereby a Cu—Ca—X film is formed on the Cu film, wherein X denotes at least one contaminant, the Cu—Ca—X film comprising a removing technique selected from a group consisting essentially of: sputtering under an Ar atmosphere, and treating in a plasma ambient for initially removing the at least one contaminant, and whereby a thin Cu—Ca film is effected on the Cu film, the thin Cu—Ca film comprising an annealing treatment for finally removing the at least one contaminant, the thin Cu—Ca film being alloyed, whereby a contaminant-reduced Cu—Ca alloy surface is formed onto the Cu film, and whereby the contaminant-reduced Cu—Ca/Cu interconnect structure, comprising the contaminant-reduced Cu—Ca alloy surface, is formed on the semiconductor device.

4. A device, as recited in claim 3, wherein the Cu film comprises a depositing technique selected from a group consisting essentially of electroplating, electroless plating, chemical vapor deposition (CVD), plasma vapor deposition (PVD), and plasma enhanced chemical vapor deposition (PECVD).

5. A device, as recited in claim 4, wherein the Cu—Ca alloy surface is Cu-rich with a Ca-doping level in a range of 0.2 atomic % to 5 atomic %.

6. A device, as recited in claim 3, wherein the electroless plating solution comprises:
 a. at least one solvent;
 b. at least one Cu salt;
 c. at least one Ca salt;
 d. at least one complexing agent; and
 e. at least one reducing agent, (b) through (e) being dissolved in (a).

7. A device, as recited in claim 6, wherein the Cu—Ca alloy surface is Cu-rich with a Ca-doping level in a range of 0.2 atomic % to 5 atomic %.

8. A device, as recited in claim 6, wherein the electroless plating solution further comprises:
 f. at least one pH adjuster; and
 g. at least one surfactant, (f) and (g) being dissolved in (a).

9. A device, as recited in claim 8, wherein the Cu—Ca alloy surface is Cu-rich with a Ca-doping level in a range of 0.2 atomic % to 5 atomic %.

10. A device, as recited in claim 3, wherein the at least one contaminant is selected from a group consisting essentially of carbon (C), sulphur (S), and oxygen (O).

11. A device, as recited in claim 3, wherein the Cu—Ca alloy surface is Cu-rich with a Ca-doping level in a range of 0.2 atomic % to 5 atomic %.

12. A semiconductor device having a contaminant-reduced copper-calcium alloy surface on a copper (Cu—Ca/Cu) interconnect structure, as recited in claim 3, wherein the Cu film a depositing technique selected from a group consisting essentially of electroplating, electroless plating, chemical vapor deposition (CVD), plasma vapor deposition (PVD), and plasma enhanced chemical vapor deposition (PECVD), wherein the Cu film comprising an electroless plating treatment, said electroless plating treatment comprising an electroless plating solution for facilitating doping of the Cu film with at least one plurality of ions selected from a group consisting essentially of Cu ions and Ca ions, the solution comprising:
a. at least one solvent;
b. at least one Cu salt;
c. at least one Ca salt;
d. at least one complexing agent;
e. at least one reducing agent;
f. at least one pH adjuster; and
g. at least one surfactant,
(b) through (g) being dissolved in (a),
whereby a Cu—Ca—X film is deposited on the Cu film, wherein X denotes at least one contaminant selected from a group consisting essentially of C, S, and O, wherein the Cu—Ca—X film comprises a removing technique selected from a group consisting essentially of sputtering under an Ar atmosphere, and treating in a plasma ambient for initially removing said at least one contaminant from the Cu—Ca—X film, and whereby a thin Cu—Ca film is effected on the Cu film, wherein the thin Cu—Ca film comprises an annealing treatment for finally removing said at least one contaminant, said annealing treatment comprising a temperature range of 250° C. to 450° C. in an environment selected from a group consisting essentially of a vacuum, an inert gas, and a reducing ambient, whereby the thin Cu—Ca film is alloyed, whereby a contaminant-reduced Cu—Ca alloy surface is formed onto the Cu film, wherein the contaminant-reduced Cu—Ca alloy surface is Cu-rich with a Ca-doping level in a range of 0.2 atomic % to 5 atomic %, and whereby the contaminant-reduced Cu—Ca/Cu interconnect structure, comprising the contaminant-reduced Cu—Ca alloy surface, is formed on the semiconductor substrate.

13. A device, as recited in claim 3, wherein the Cu film comprises a depositing technique selected from a group consisting essentially of electroplating, electroless plating, chemical vapor deposition (CVD), plasma vapor deposition (PVD), and plasma enhanced chemical vapor deposition (PECVD).

14. A device, as recited in claim 13, wherein the Cu—Ca alloy surface is Cu-rich with a Ca-doping level in a range of 0.2 atomic % to 5 atomic %.

15. A device, as recited in claim 3, wherein the electroless plating solution comprises:
a. at least one solvent;
b. at least one Cu salt;
c. at least one Ca salt;
d. at least one complexing agent; and
e. at least one reducing agent, (b) through (e) being dissolved in (a).

16. A device, as recited in claim 15, wherein the electroless plating solution further comprises:
f. at least one pH adjuster; and
g. at least one surfactant, (f) and (g) being dissolved in (a).

17. A device, as recited in claim 15, wherein the Cu—Ca alloy surface is Cu-rich with a Ca-doping level in a range of 0.2 atomic % to 5 atomic %.

18. A device, as recited in claim 3, wherein the at least one contaminant is selected from a group consisting essentially of carbon (C), sulphur (S), and oxygen (O).

19. A device, as recited in claim 3, wherein the Cu—Ca alloy surface is Cu-rich with a Ca-doping level in a range of 0.2 atomic % to 5 atomic %.

* * * * *